United States Patent [19]

Yokogawa

[11] Patent Number: 4,637,003
[45] Date of Patent: Jan. 13, 1987

[54] AMPLITUDE MODULATED HIGH FREQUENCY SIGNAL DETECTION DEVICE

[75] Inventor: Fumihiko Yokogawa, Tokorozawa, Japan

[73] Assignee: Pioneer Electronic Corporation, Tokyo, Japan

[21] Appl. No.: 683,393

[22] Filed: Dec. 19, 1984

[30] Foreign Application Priority Data

Dec. 20, 1983 [JP] Japan ................... 58-241240

[51] Int. Cl.[4] ............... G11B 21/10; H03K 5/153
[52] U.S. Cl. ............................... 369/32; 369/33; 307/351; 307/355; 328/147; 328/150
[58] Field of Search ............... 369/32, 33, 41; 307/351, 352, 355, 356; 328/146, 147, 150, 151; 360/73, 78; 329/204

[56] References Cited

U.S. PATENT DOCUMENTS

| | | | |
|---|---|---|---|
| 3,893,180 | 7/1975 | Braun et al. | 307/351 |
| 4,093,832 | 6/1978 | Isaacson et al. | 369/33 |
| 4,156,202 | 5/1979 | Takahashi | 328/147 |
| 4,219,152 | 8/1980 | Couch et al. | 307/351 |
| 4,241,455 | 12/1980 | Eibner | 307/355 |

Primary Examiner—Aristotelis M. Psitos
Assistant Examiner—Steven R. Garland
Attorney, Agent, or Firm—Schwartz, Jeffery, Schwaab, Mack, Blumenthal & Evans

[57] ABSTRACT

A high frequency signal detection device to be used in an information playback system for playing back signals from a record medium having a plurality of record tracks, includes first and second positive peak hold circuits having different time constant and a negative peak hold circuit. A difference circuit is provided to generate a difference signal between output signals of the first positive peak hold circuit and the negative peak hold circuit and an output signal of the difference circuit is compared with an output signal of the second positive peak hold circuit, to produce a high frequency signal detection signal. Thus, a very accurate detection signal is produced irrespective of the polarity of the input signal and whether or not the envelope of the high frequency signal is symmetric.

2 Claims, 16 Drawing Figures

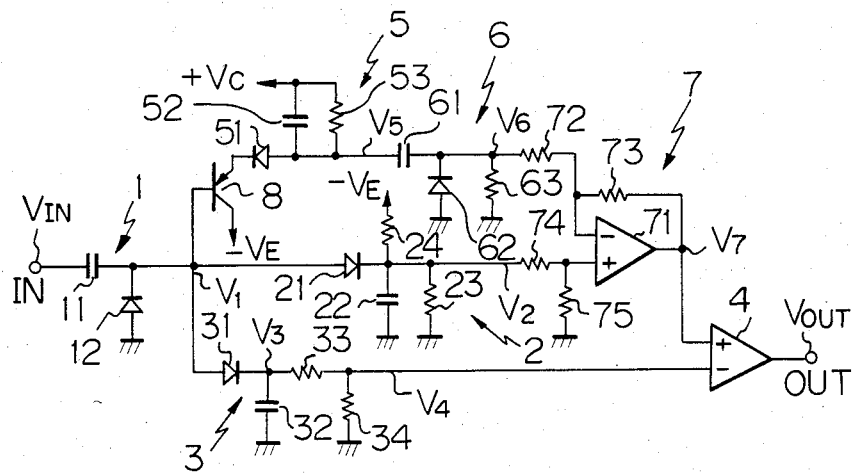
Fig. 4
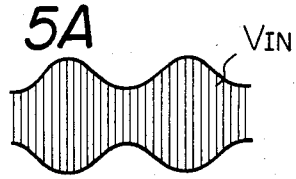
Fig. 5A
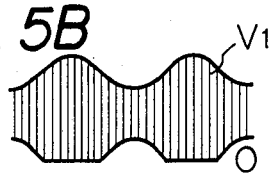
Fig. 5B
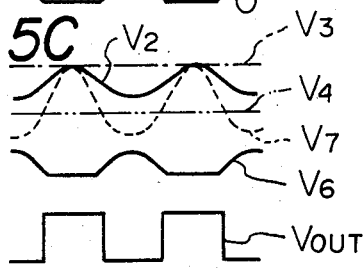
Fig. 5C
Fig. 5D
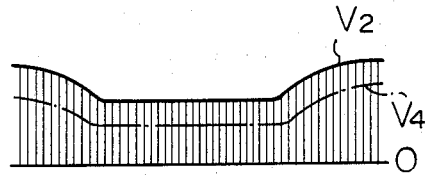
Fig. 6
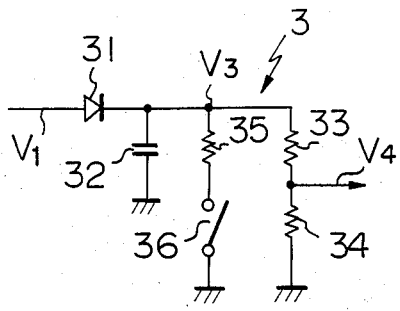
Fig. 7

AMPLITUDE MODULATED HIGH FREQUENCY SIGNAL DETECTION DEVICE

BACKGROUND OF THE INVENTION

1. Field of the Invention

The present invention relates to an amplitude modulated high frequency signal detection device, and more specifically to a device for detecting a playback high frequency (referred to as HF hereinafter throughout the specification) signal, to be used in a system for playing back recorded information, such as an optical video disc player system in which an amplitude modulated HF signal is detected when a pickup is moved across a plurality of record tracks.

2. Description of Background Information

In playback systems or record/playback systems such as optical video disc player systems, an HF pickup output signal is amplitude modulated when the pickup is moved across the record tracks, i.e., along a direction perpendicular to the record tracks. This amplitude modulated HF signal is then treated by a signal detection device in which the envelope of the input HF signal is compared with a reference signal to produce a detection signal. The output signal of the detection device is, for example, used as an input signal of a pickup position control device. In the signal detection device, the reference signal is produced also from the HF input signal using a voltage divider circuit responsive to peak values of the HF signal.

A shortcoming of the conventional HF signal detection device is that the detection of the signal may sometimes be difficult in such an occasion that the polarity (or the side where its envelope has higher amplitude than the other side with respect to the central level of the HF signal) is reversed, or if a time constant of a pre-processing stage is too small.

Further, there was another problem that the duty ratio of the detection signal is affected by a change in the relative speed between the pickup and the record tracks on the recording disc. Thus, in conventional detection devices, there was necessarily an error between the actual position of the pickup and the edge positions of the detection signal due to the change in the relative speed between the pickup and record tracks.

SUMMARY OF THE INVENTION

An object of the present invention is therefore to provide an HF signal detection device which is capable of producing a very accurate detection signal irrespective of the polarity of the HF signal or irrespective of whether or not the HF signal is symmetric.

According to the present invention, the HF signal detection device comprises a first positive peak hold circuit for holding the level of positive peaks of the input signal, a second positive peak hold circuit for holding the level of the positive peaks of the input signal and having a time constant greater than a time constant of the first peak hold circuit, a negative peak hold circuit for holding the level of negative peaks of the input signal, a difference circuit for producing a difference signal corresponding to a difference between an output signal of the first peak hold circuit and an output signal of the negative peak hold circuit, and a comparator circuit for producing a signal detection output signal by comparing a signal corresponding to an output signal of the second positive peak hold circuit with the difference signal.

Further scope and applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 4 is a circuit diagram showing a circuit construction of an embodiment of the signal detection device according to the present invention;

FIGS. 5A through 5D are waveform diagrams showing waveforms of signals observed at various points of the circuit of FIG. 4; and FIG. 6 is a waveform diagram showing a waveform of the HF signal when a level drop occurs due to a dirt;

FIG. 7 is a circuit diagram showing a part of another embodiment of the signal detection device according to the present invention.

DETAILED DESCRIPTION OF THE PREFERRED EMBODIMENT

Figure 1:
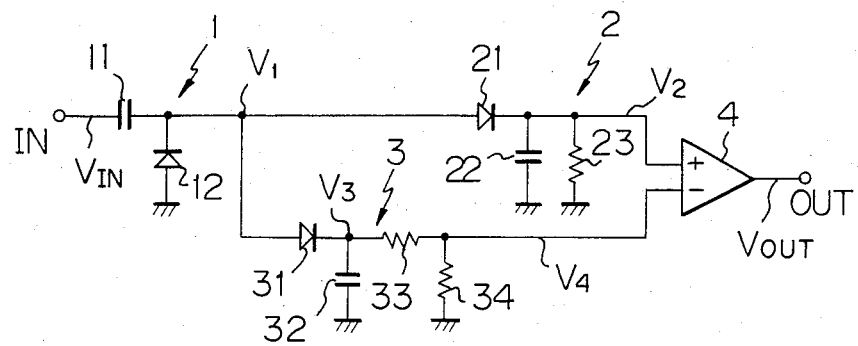
FIG. 1 is a circuit diagram illustrating a circuit construction of a conventional signal detection device.

Before entering into the explanation of the embodiments of the signal detection device according to the present invention, reference is first made to FIG. 1 showing an example of the construction of the conventional signal detection device.

In FIG. 1, an HF signal produced at an optical pickup is amplified in an amplifier circuit (not illustrated) and then applied to a clamping circuit 1 for clamping the negative side peaks (or envelope) of the input signal substantially at a ground level. The clamp circuit 1 is made up of a capacitor 11 and a clamp diode 12. In this explanation, the forward voltage drop of the clamp diode is disregarded for the purpose of simplification. An output clamp signal $V_1$ of the clamp circuit 1 is, in turn, coupled to first and second positive peak hold circuits 2 and 3. The first positive peak hold circuit 2 is made up of a diode 21, a capacitor 22, and a resistor 23, and the second peak hold circuit 3 is made up of a diode 31, a capacitor 32, and resistors 33 and 34. The time constant of the second peak hold circuit 3 is determined to be by far greater than the time constant of the first peak hold circuit 2.

The first peak hold circuit 2 produces a hold output signal $V_2$ and the second peak hold circuit 3 produces a hold output signal $V_3$ which is, in turn, applied to a voltage divider circuit of itself and a divided signal $V_4$ is produced. The hold output signal $V_2$ of the first peak hold circuit 2 is compared with the divided signal $V_4$ at a level comparator 4. An output signal of the level comparator 4 forms an output signal of the signal detection device.

Figure 2A:
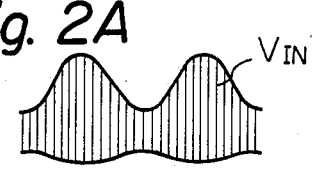
FIGS. 2A through 2D are waveform diagrams illustrating waveforms of signals observed at various points of the circuit shown in FIG. 1 when the device operates with a normal input signal.
Figure 2B:
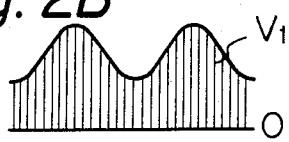
Figure 2C:
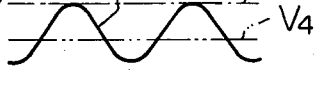

The operation of this device will be explained hereinafter. Assume that a readout signal from the optical pickup has such a waveform as illustrated in FIG. 2A. Then the negative side peaks or envelope of the readout signal is clamped at substantially ground level by the clamp circuit 1. The waveform of the clamp signal $V_1$ becomes such as illustrated in FIG. 2B. This clamp signal $V_1$ is then transformed to hold signals $V_2$ and $V_3$ respectively illustrated at the solid line and the partly dotted line of FIG. 2C after passing through the peak hold circuits 2 and 3. The hold signal $V_3$ is divided by the voltage divider circuit of resistors 33 and 34 and the divided signal $V_4$ which is illustrated at the dash and chain line of FIG. 2C.

Figure 2D:

Accordingly, the output signal of the level comparator 4 becomes a rectangular pulse signal such as illustrated in FIG. 2D. Specifically, when the pickup is located right above a record track and the HF signal is produced at a maximum level, a high level detection signal is produced by the comparator 4. On the other hand, when the pickup is located right above an intermediate position between two of record tracks and the HF signal is not produced or produced at very low level, a low level detection signal is produced by the level comparator 4.

In order to operate the above explained detection device properly, the input HF signal must be such that one of upper and lower envelopes which has a greater amplitude than the other is on the positive side and moreover it is necessary that the frequency response of the amplifier of the previous stage, of low end, is extended to a sufficiently low frequency.

The problem will now be discussed more in detail. If the HF signal is so processed in a waveform shaping circuit of the previous stage that the upper and lower envelops of HF signal swing symmetrically above and below a central level, there will be a problem when the relative speed of between the pickup and the record track along a direction perpendicular to the record tracks becomes high.

Figure 3A:
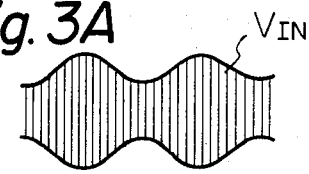
FIGS. 3A through 3D are waveform diagrams similar to FIGS. 2A through 2D, illustrating the waveform of signals when the relative speed between the pickup and the record tracks is high.
Figure 3B:
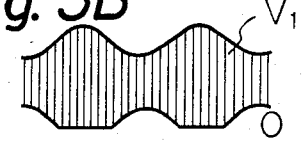
Figure 3C:
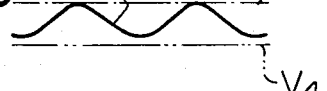
Figure 3D:

Specifically, in that case, not only the upper envelope, the lower envelope of the HF signal Vin swings as illustrated in FIG. 3A. Further, the amplitude of the swing of the lower envelope becomes greater than the amplitude of the swing of the upper envelope of the HF signal. In this state, the clamp signal $V_1$ has such a waveform as illustrated in FIG. 3B. Moreover, there may be a case that the upper envelope, i.e., the envelope $V_2$ of the positive peaks of HF signal, does not go lower than the level of the reference signal $V_4$. Thus, in this state, the comparator 4 no more produces the rectangular pulse signal and the detection of HF signal becomes impossible.

This type of problem also occur in such cases that the polarity of the HF signal is in an inverse relation with respect to the waveform of FIG. 2A and in such a case that the time constant of the amplifier of the previous stage is too small, as mentioned before. Therefore, also in those cases, the level of the envelope $V_2$ does not go lower than the level of the reference signal $V_4$, and the comparator 4 fails to produce the output signal.

Further, even through the level of the envelope $V_2$ goes lower than the level of the reference signal $V_4$, the amplitude of the envelope $V_2$ varies with the change in the relative speed between the pickup and the record tracks. Therefore, the duty ratio of the HF signal detection signal varies with the change in this relative speed. Such changes of the duty ratio of the HF signal results in an error between the actual position of the pickup and the position of the leading edge or trailing edge of the HF signal detection signal.

First embodiment of the HF signal detection device according to the present invention will be explained hereinafter with reference to FIGS. 4 through 7 of the accompanying drawings.

In FIG. 4, a readout signal of an optical pickup is supplied to a clamp circuit 1 via an amplifier (not shown). The clamp circuit 1 is, as in the conventional device, made up of a capacitor 11 and a clamp diode 12 whose forward voltage drop is disregarded in this explanation. An output signal, i.e., a clamp signal $V_1$ of the clamp circuit 1 is, in turn, coupled to first and second positive peak hold circuits 2 and 3 and also to a negative peak hold circuit 5 through a buffer transistor 8. The first positive peak hold circuit 2 is made up of a diode 21, a capacitor 22 and a resistor 23, and the second positive peak hold circuit 3 is made up of a diode 31, a capacitor 32, and resistors 33 and 34. The first positive peak hold circuit 2 produces a peak hold signal $V_2$ and the second positive peak hold circuit 3 produces a divided signal $V_4$. The negative peak hold circuit 5 is made up of a diode 51, a capacitor 52, and a resistor 53, and an output signal $V_5$, i.e., a negative peak hold signal is applied to a clamp circuit 6. The clamp circuit 6 includes a capacitor 61, a clamp diode 62, and a pull down resistor 63 and the clamp circuit 6 produces a clamp signal $V_6$. The clamp signal from the clamp circuit 6 and the peak hold signal $V_2$ from the first peak hold circuit 2 are coupled to an inverting input and a non inverting input of a differential amplifier 7. The differential amplifier 7 is made up of an operational amplifier 71, and resistors 72 through 75. An output signal $V_7$ from this differential amplifier 7 is applied to a level comparator 4 as one of two input signals.

The divided signal $V_4$ from the second positive peak hold circuit 3 is applied to the level comparator 4 as the other one of the input signals. In addition, the signal level at the output signal line of the first peak hold circuit 2 is pulled down to a negative potential by means of a resistor 24 connected to a source of a negative potential.

The operation of the HF signal detection device according to the present invention, whose construction is described above will be explained hereinafter.

When an HF signal having a waveform such as illustrated in FIG. 2A is applied, negative side peaks of the signal is clamped at substantially ground level by the clamp circuit 1. Therefore, the signals $V_5$ and $V_6$ produced by the negative peak hold circuit 5 and the clamp circuit 6 are at the ground level. Therefore, the output signal $V_7$ of the differential amplifier 7 becomes identical with the peak hold signal $V_2$ of the first positive peak hold circuit 2. In this state, the device produces a rectangular pulse signal which is the same as the signal of FIG. 2D. Thus, the operation of the device according to the present invention is the same as the operation of the device of FIG. 1 under this condition.

Nextly, if the input HF signal has an asymmetric waveform as illustrated in FIG. 5A, then the peak hold signal $V_5$ of the negative peak hold circuit 5 and the clamp signal $V_6$ of the clamp circuit 6 become substantially identical with each other and which are illustrated by way of the signal $V_6$ in FIG. 5C. This signal $V_6$ and the peak hold signal $V_2$ of the first positive peak hold circuit 2 are applied to a differential amplifier 71 which, in turn, produces the signal $V_7$ corresponding to the difference between the input signals, which is illustrated by the dashed line of FIG. 5C. In short, the output signal V₇ of the differential amplifier 7 has substantially the same waveform as that of the positive envelope of the signal of FIG. 2A. Thus, the amplitude of the output signal of the differential amplifier 7 is large enough and it goes lower than the level of the reference signal $V_4$.

In this way, an accurate HF signal detection signal, that is, an accurate information of relative position between the pickup and the position of the record tracks, is obtained.

When no input signal is applied, the level of the signal $V_6$ is pulled down to the ground level by means of the pull down resistor 63 and the level of the signal $V_2$ is pulled down by means of the negative side by means of the pull down resistor 24. Therefore, the output signal $V_7$ of the differential amplifier 7 goes to the negative side. On the other hand, the signal $V_4$ is at the ground level, the comparator 4 continuously produces the low level signal, and the detection of the absence of the input signal is performed.

If the envelope of the input HF signal gradually decreases as illustrated in FIG. 6, due to a dirt such as the finger print on the surface of the disc, then the level of the output signal (divided signal) $V_4$ of the second positive peak hold circuit 3 will gradually decrease in responce to the level down of the HF signal. Thus, it is advantageous that the output signal state of the comparator 4 does not reversed by the level down of the input HF signal.

FIG. 7 shows a second embodiment of the HF signal detection device according to the present invention, which is characterized in that the time constant of the second positive peak hold circuit 3 is varied by means of a switch 36 and a resistor 35 connected in parallel with the resistors 33 and 34. Due to the necessity to follow the level drop of the input HF signal caused by the above mentioned reason and illustrated in FIG. 6 when the disc player system operates normally, it is necessary to set the time constant of the second positive peak hold circuit 3 at relatively small value. Therefore, the switch 36 is turned "on" and as a result, the resistor 35 is inserted into the circuit in parallel with the resistors 33 and 34.

On the other hand, during special playback mode of the player system, such as an occasion of searching a desired one of record tracks, it is necessary to detect the position of the record track very accurately. Therefore, during such time of the operations of the player system the switch 36 is turned "off" to shift the time constant of the second positive peak hold circuit 3 to a greater side.

Thus, according to the present invention, the HF signal detection device is presented by which a very accurate detection signal is obtained irrespective of the polarity of the input HF signal and irrespective of whether or not the input HF signal is symmetric.

Above, preferred embodiments of the present invention have been described. It should be understood, however, that the foregoing description is for illustrative purpose only, and is not intended to limit the scope of the invention. Rather, there are numerous equivalents to the preferred embodiments, and such are intended to be covered by the appended claims.

As an example, the clamp circuit 6 of FIG. 4 can be omitted, while the pull down resistor 63 is necessary in that case.

What is claimed is:

1. A high frequency signal detection device to be used in an information playback system for playing back information from a record medium having a plurality of record tracks by means of a pickup, comprising:
    a first positive peak hold circuit responsive to a high frequency input signal from the pickup, for holding positive peaks of the high frequency input signal and having a first predetermined time constant;
    a second positive peak hold circuit responsive to said high frequency input signal, for holding positive peaks for the high frequency input signal and having a second predetermined time constant which is greater than said first predetermined time constant;
    a negative peak hold circuit responsive to the high frequency input signal, for holding negative peaks of the high frequency input signal;
    a difference circuit connected to said first positive peak hold circuit and said negative peak hold circuit, and for generating a difference signal between an output signal of said first positive peak hold circuit and an output signal of said negative peak hold circuit; and
    a comparator circuit connected to said difference circuit and said second positive peak hold circuit for comparing said difference signal with a signal corresponding to a peak hold output signal of said second positive peak hold circuit, and producing a comparator output signal as a detection signal of the high frequency input signal.

2. A high frequency signal detection device as set forth in claim 1, wherein said second positive peak hold circuit is so constructed that the second predetermined time constant thereof is variable.

* * * * *